US008617993B2

(12) United States Patent
Yasseri et al.

(10) Patent No.: US 8,617,993 B2
(45) Date of Patent: Dec. 31, 2013

(54) METHOD OF REDUCING PATTERN COLLAPSE IN HIGH ASPECT RATIO NANOSTRUCTURES

(75) Inventors: Amir A. Yasseri, San Jose, CA (US); Ji Zhu, El Cerrito, CA (US); Seokmin Yun, Pleasanton, CA (US); David S. L. Mui, Fremont, CA (US); Katrina Mikhaylichenko, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 546 days.

(21) Appl. No.: 12/697,862

(22) Filed: Feb. 1, 2010

(65) Prior Publication Data

US 2011/0189858 A1 Aug. 4, 2011

(51) Int. Cl.
*H01L 21/302* (2006.01)
*H01L 21/461* (2006.01)
*H01L 21/31* (2006.01)
*H01L 21/469* (2006.01)

(52) U.S. Cl.
USPC ............ 438/689; 216/67; 427/98.8; 438/758; 438/765

(58) Field of Classification Search
USPC .......... 216/67; 427/98.4, 98.6, 98.8; 438/694, 438/696, 706, 710, 765, 758, 759
See application file for complete search history.

(56) References Cited

U.S. PATENT DOCUMENTS

| 6,068,911 | A | 5/2000 | Shouji et al. |
| 6,605,413 | B1 | 8/2003 | Lyons et al. |
| 6,849,389 | B2 | 2/2005 | Mahorowala |
| 7,005,390 | B2 | 2/2006 | Ramachandrarao et al. |
| 7,229,936 | B2 | 6/2007 | Brodsky et al. |
| 2003/0017420 | A1 | 1/2003 | Mahorowala |
| 2004/0248331 | A1* | 12/2004 | Cox et al. ......... 438/22 |
| 2004/0259004 | A1 | 12/2004 | Wunnicke et al. |
| 2005/0133827 | A1* | 6/2005 | Huang et al. ......... 257/213 |
| 2006/0057507 | A1 | 3/2006 | Chang et al. |
| 2007/0254169 | A1* | 11/2007 | Kamins et al. ......... 428/447 |
| 2008/0063984 | A1 | 3/2008 | Zhang et al. |
| 2009/0104347 | A1 | 4/2009 | Van Benthem et al. |
| 2009/0229638 | A1* | 9/2009 | Yun et al. ......... 134/26 |

(Continued)

FOREIGN PATENT DOCUMENTS

JP 2005115171 A * 4/2005

OTHER PUBLICATIONS

Chen et al. "Super-hydrophobic and /or super-hydrophilic surfaces made by plasma process," NSTI-Nanotech 2009 Technical Proceedings 1-3, 194-197 (2009).*

(Continued)

*Primary Examiner* — Allan Olsen
*Assistant Examiner* — Margaret D Klunk
(74) *Attorney, Agent, or Firm* — Beyer Law Group LLP

(57) ABSTRACT

A method is provided for treating the surface of high aspect ratio nanostructures to help protect the delicate nanostructures during some of the rigorous processing involved in fabrication of semiconductor devices. A wafer containing high aspect ratio nanostructures is treated to make the surfaces of the nanostructures more hydrophobic. The treatment may include the application of a primer that chemically alters the surfaces of the nanostructures preventing them from getting damaged during subsequent wet clean processes. The wafer may then be further processed, for example a wet cleaning process followed by a drying process. The increased hydrophobicity of the nanostructures helps to reduce or prevent collapse of the nanostructures.

11 Claims, 5 Drawing Sheets

(56) References Cited

U.S. PATENT DOCUMENTS

2009/0236627 A1  9/2009 Kim et al.
2009/0311874 A1* 12/2009 Tomita et al. ................. 438/759
2010/0099232 A1*  4/2010 Rana et al. .................... 438/396
2010/0122711 A1*  5/2010 Ryan ................................ 134/2

OTHER PUBLICATIONS

Zhuang et al. "Vapor-phase self-assembled monolayers for anti-stiction applications in MEMS" J Microelectromech. Sys. Dec. 2007, 16(6), p. 1451-1460.*

Xiu et al. "Hierarchical silicon etched structures for controlled hydrophobicity/superhydrophobicity" Nano Letters, Oct. 11, 2007, 7(11), p. 3388-3393.*

Wang et al. "Self-assembled silane monolayers: fabrication with nanoscale uniformity" Langmuir, 2005, 21, p. 1848-1857.*

International Search Report dated Aug. 25, 2011 from International Application No. PCT/US2011/022075.

Written Opinion dated Aug. 25, 2011 from International Application No. PCT/US2011/022075.

* cited by examiner

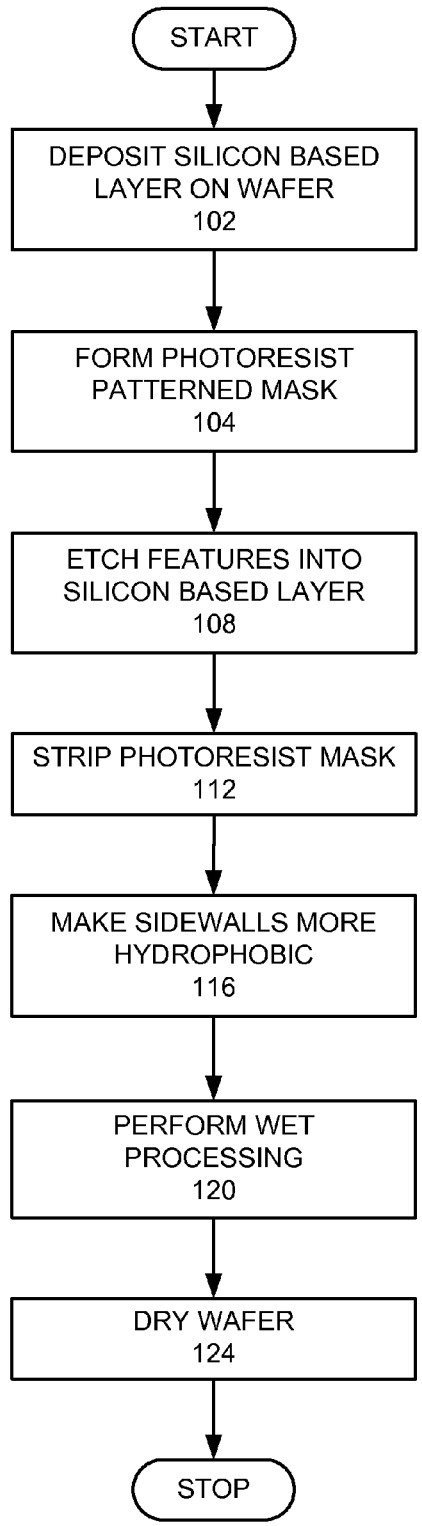
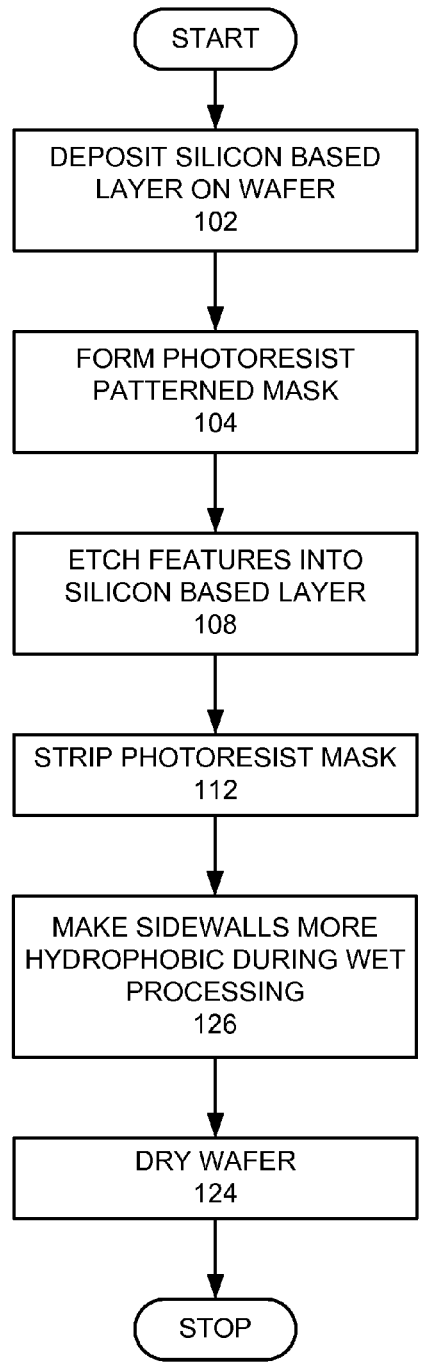
FIG. 1A
FIG. 1B

METHOD OF REDUCING PATTERN COLLAPSE IN HIGH ASPECT RATIO NANOSTRUCTURES

BACKGROUND OF THE INVENTION

1. Field of the Invention

The invention relates to semiconductor devices. More specifically, the present invention relates to the production of semiconductor devices where wet chemical treatments are used on a wafer with high aspect ratio nanostructures that are sensitive to pattern collapse during processing.

2. Description of the Related Art

Semiconductor devices are fabricated using a long complex procedure. One portion of the procedure involves etching features into a stack of materials on a silicon wafer. The stack of materials may comprise a single layer of silicon based material such as SiO or SiN, or the stack may comprise multiple layers of materials such as SiO, SiN, TEOS, polysilicon or silicon in different orders within the stack. The stack may be formed by a number of methods, including physical vapor deposition, chemical vapor deposition, electrochemical deposition and molecular beam epitaxy, for example. Once the stack of materials is created, a photoresist layer is applied. This photoresist layer is used as a mask for etching. Many methods of etching may be used including methods of wet etching and dry etching. After the etching, the photoresist layer is usually removed, often by a plasma ashing procedure.

During the fabrication, the wafers are subjected to wet processing such as wet cleaning. Wet cleaning is helpful to prepare the surfaces and to remove residue left behind by some of the other processing. The cleaning process usually consists of chemical treatment in combination with megasonics, jets and/or other particle removal techniques followed by rinsing and drying. The drying may include bulk liquid removal from the surface by spin off, vacuum suction, Marangoni effect with isopropyl alcohol or combination of these commonly known techniques A wafer may go through multiple occurrences of these steps during the entire fabrication process. Hence, as device features shrink on a wafer and as much liquid is used in the processing, strong capillary forces may exert enough force to collapse the structures during drying steps.

SUMMARY OF THE INVENTION

To achieve the foregoing and in accordance with the purpose of the present invention, a method of processing a wafer used in fabricating semiconductor devices is provided. The method teaches processing the wafer in such a way as to reduce or eliminate collapse of high aspect ratio features on the wafer. High aspect ratio features are formed in a silicon based layer that has been produced on the wafer. The sidewalls of the features are treated to make them more hydrophobic. A wet processing of the wafer is performed on the wafer and then the wafer is dried.

In another embodiment, a method of processing a wafer used in fabricating semiconductor devices is provided. High aspect ratio features are formed in a silicon based layer on the wafer. A wet processing of the wafer is performed. The wet processing includes wet cleaning the wafer, depositing a primer on the wafer that modifies surface properties of the features so as to increase the hydophobicity of the surfaces of the features and rinsing the wafer. After the wet processing, the wafer is then dried.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which:

FIGS. 1A and 1B show high level flow charts of some embodiments of the invention.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Oxides and nitrides of silicon grown by low-temperature oxidation (LTO), chemical vapor deposition (CVD) and implantation have been traditionally used in front-end-of-the-line (FEOL) processing for electrical and thermal isolation, masking and encapsulation in high aspect ratio nanostructures. The use of such materials in FEOL applications has continued to offer the selectivity to reduce feature sizes and increase aspect ratios to achieve the desired densities of devices for 32 nm integrated circuit (IC) fabrication and beyond. Aspect ratios are now commonly in the range of 10:1 to 25:1 and possibly higher. However, as the critical dimensions continue to shrink and aspect ratios continue to increase in FEOL applications, problems associated with processing such densely fabricated nanostructures have surfaced and are anticipated to pose tremendous challenges for wet clean processes. One commonly observed problem has been the collapse of densely packed high aspect ratio nanostructures used for shallow trench isolation.

Figure 2A:
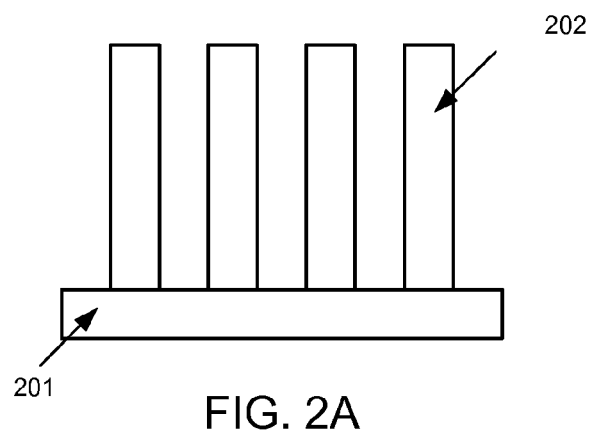
FIGS. 2A-2C show an exemplary wafer undergoing a damaging wet processing and drying.
Figure 2B:
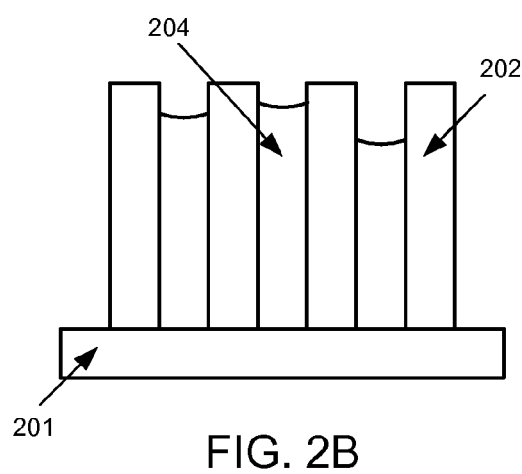
Figure 2C:
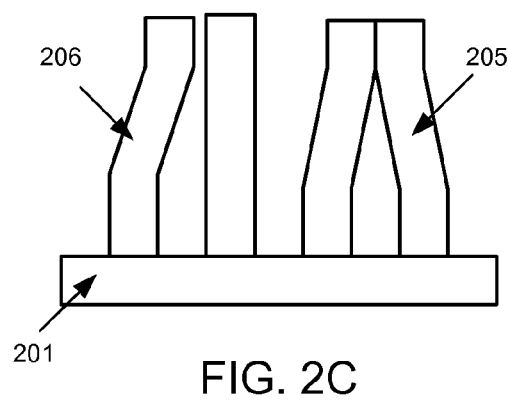

FIG. 2A shows a wafer 201 together with a set of nanostructures 202. Feature collapse occurs during wet cleaning and subsequent drying. FIG. 2B shows the nanostructures 202 of FIG. 2A during a wet cleaning where the fluid 204 has gathered between the nanostructures 202. Fluid enters the features during wet processing and strong capillary forces may exert sufficient force to damage the delicate nanostructures. In addition, the surface tension forces of the drying liquid tend to pull surfaces of adjacent nanostructures into contact. These forces are often exacerbated by the lack of balance of pressures across the many features due to non-uniformity of the fluid amounts gathered in the features, as well as non-uniformity in drying. These forces often lead to the collapse of the features individually or also through bridging. Bridging occurs when at least two adjacent nanostructures collapse against one another and become adhered together. The sidewalls of adjacent nanostructures themselves may adhere together, or a residue material may gather between the nanostructures, joining them together. FIG. 2C shows two examples of feature collapse. One example is the single collapse of a nanostructure 206. The other example shows a bridging of two nanostructures 205. Other types of feature collapse are possible as well. Feature collapse can be a significant problem in semiconductor fabrication and can lead to defects in the circuits produced.

Some methods of reducing feature collapse have been explored. Examples include rinsing with ultra-low surface tension liquids such as 2-propanaol γ=22 dynes/cm, use of fluorinated organic surfactants (HFE, γ=14 dynes/cm) supercritical carbon dioxide drying, and drying using similar approaches at elevated temperatures. Some of these techniques have met with limited success; however, such techniques are costly and often require elaborate setups. For example, supercritical carbon dioxide requires high pressures to go to the critical point.

A wafer may go through multiple occurrences of wet processing and drying during the entire fabrication process. As device features shrink on a wafer, strong capillary forces may exert enough force to collapse the structures during drying steps. A cost-effective and simple method of processing the wafers is needed that reduces the occurrence of the collapsing of high aspect ratio nanostructures during sequential wet processing. In light of this notion, the present invention outlines a methodology that can be used during single wafer wet cleaning of high aspect ratio nanostructures on a wafer to avoid collapse and sticking.

FIG. 1A is a high level overview of an embodiment of the invention. At the start of the method, at least one silicon based layer is deposited upon a wafer (step 102). A photoresist patterned mask is formed over the silicon based layer (step 104) and features are etched into the silicon based layer using the photoresist as a mask (step 108). The photoresist mask is then stripped away (step 112). A procedure is then used to make the sidewalls of the features more hydrophobic (step 116). In one embodiment, this procedure may include depositing a primer on the wafer that chemically alters the surface of the features as a first step in the process flow without needing to wet the features. This step can be carried out by exposing the surface of interest to the vapor of the modifying agent prior to the wet processing. Wet processing is then performed on the wafer (step 120), which may include a sequential series of wet cleaning steps to clean the features of common residues left behind after etch. The wafer is then dried (step 124).

FIG. 1B is a high level overview of another embodiment of the invention. In this embodiment, the steps of making the sidewalls more hydrophobic (step 116) and the wet processing (step 120) are combined into one step of making the sidewalls more hydrophobic during the wet processing (step 124). For example this step can be carried out by exposing the surface of interest to a liquid solution that contains the modifying agent prior to or after the wet clean sequence. The liquid solution that contains the surface modifying agent can be derived from solvents that are miscible with the agent such as n-Hexane, Toluene, NPM, DMSO, Acetone, DMF, DMAC, or HFEs. The other steps may be left unchanged.

Figure 3A:
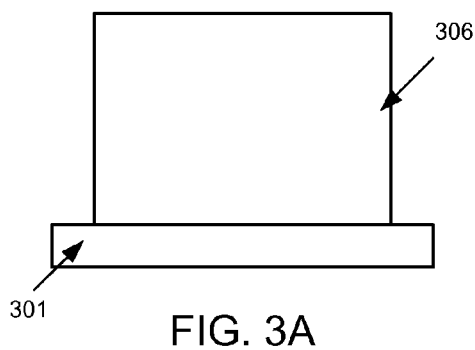
FIGS. 3A-3G show an exemplary wafer undergoing select steps of an embodiment of the invention.

FIGS. 3A-3G show an example of a wafer with high aspect nanostructures at selected steps of an embodiment of the disclosed method. FIG. 3A shows the result after step 102 has been performed. A layer of silicon based material 306 has been formed on the wafer 301. There are many processes that may be used to form the silicon based layer 306. For example, the layer may be formed by physical vapor deposition, chemical vapor deposition, electrochemical deposition or molecular beam epitaxy. While FIG. 3A shows a single uniform silicon based layer 306, it is important to note that multiple layers of materials may be used depending on many factors, such as the intended use of the circuit being fabricated or the specific fabrication process being used. Examples of multilayer structures include a common shallow trench isolation (STI) stack consisting of TEOS at the top followed by SiN, then PolySi, and then Si at the bottom, or a stack consisting of SiN at the top followed by TEOS, then another layer of SiN, then PolySi, and then Si at the bottom. In another embodiment, a silicon based layer 306 is not formed on the wafer 301. Instead, the silicon wafer 301 is etched.

Figure 3B:
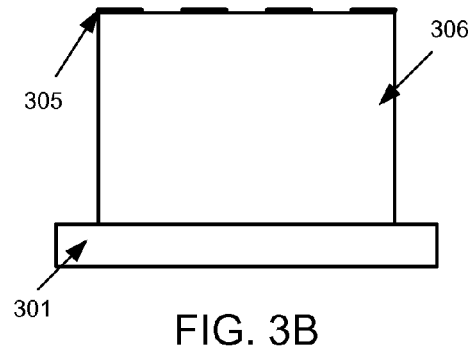

FIG. 3B shows the wafer 301 with the layer of silicon based material 306 and a photoresist layer 305 that has been patterned. A photoresist layer 305 is deposited on the silicon based material, often using a spin coating process and the photoresist is patterned using photolithography (step 104). The photoresist layer 305 is used as a mask to determine what silicon based material to remove and what to leave behind during the etching process. A wet or dry etching process (step 108) is used to remove the material not covered by the photoresist 305.

Figure 3C:
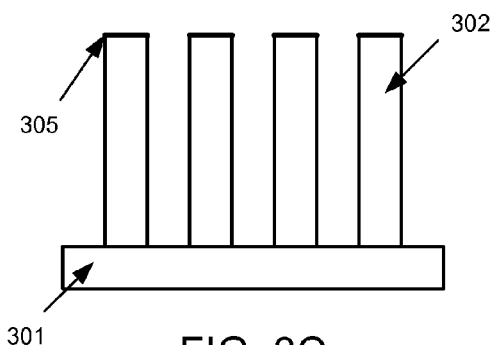

FIG. 3C shows the wafer 301 after the etching, showing the nanostructures 302 formed by the etching (step 108). At this point the photoresist 305 is still present. After the etching, the photoresist material may then be removed (step 112). The photoresist may be removed by a chemical stripping process or by an ashing process.

Figure 3D:
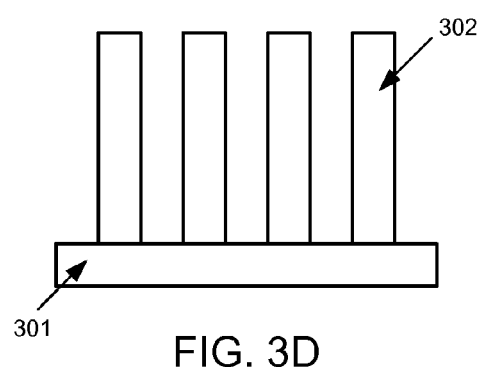

FIG. 3D shows a wafer 301 and four columns of the silicon based material that remains after etching and photoresist removal. The columns of the silicon based material make up the nanostructures 302. It is important to note that while the figures show a particular example of features that may be etched on the wafer 301, other numbers and types of features are possible.

Figure 3E:
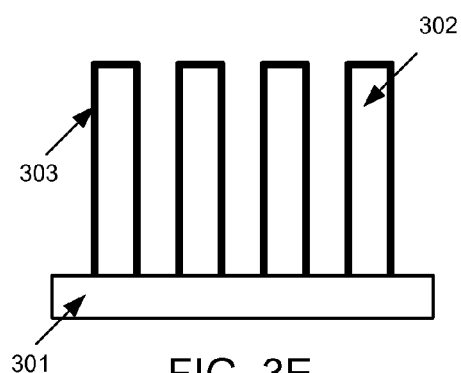

FIG. 3E shows the wafer 301 and nanostructures 302 after a layer of primer 303 has been deposited on the nanostructures 302 (step 116). The primer 303 may be a monolayer formed by self-assembly or any other known deposition process. Alternatively, the primer layer 303 may be thicker, such as a film. Some examples of possible surface modifying agents include hexamethyldisiloxane (HMDS), and various alkoxysilanes and alkylsilanes. More specifically, fluorinated or long chain hydrocarbon based trichlorosilane, dichlorosilane, monochlorosilane, trimethoxysilane, dimethoxysilane, methoxysilane, triethoxysilane, diethoxysilane, and ethoxysilane to name a few examples.

Adding the primer 303 to the nanostructures 302 helps reduce feature collapse by modifying the surface properties of the nanostructures 302. The surface of the nanostructures 302 is chemically altered such that the stiction force between two adjacent surfaces is reduced or preferably eliminated by making the surfaces of the nanostructures 302 more hydrophobic. One example of a chemical modification that would modulate stiction would be substituting polar hydroxyl groups of a nanostructure surface (for example Si—O or Si—N, often used to fabricate high aspect ratio nanostructures) with nonpolar groups, such as Si—CH3, Si—R or Si—RF (where R is a hydrocarbon or fluoro substituted chain of n-length). The Si—CH3 groups may be provided, for example, by HDMS ($C_6H_{18}OSi_2$). Another example of chemical modifier is 1H, 1H, 2H, 2H-perfluorooctyltrichlorosilane (FOTS, $C_8F_{13}H_4SiCl_3$). The presence of nonpolar groups provides a stable modified surface with DI water contact angles varying from 70-130° where development of excessive forces due to liquid meniscus formation can be prevented.

The primer 303 may be added before the wet phase of processing via reaction of the surface with its vapor. When added before the wet phase, the primer 303 additionally acts to minimize or prevent the excessive stictional forces that are often exerted by the adsorption of water on surfaces that are in close proximity. A sample process flow using FOTS is first generating a stock solution of chemical modifier by mixing a solution of 0.1-50% FOTS by weight with anhydrous n-hexane, then co-heating one drop of the stock solution with the sample to be modified in an oven at a temperature of 40-200° C. After approximately 2-300 seconds, the stock solution evaporates completely and FOTS molecule reacts with the sample surface. A surface prepared this way has DI water contact angle larger than 120°.

Alternatively, the primer may be added during the wet phase processing (step 126) by use of suitable solvents containing the modifying agent. This step could be applied either before or after the wet clean steps in the sequential process flow. A sample process using FOTS is immersing the sample into 0.01-50% by weight of FOTS in HFE-7100 (3M, Minneapolis, Minn.), Toluene, n-hexane, chloroform, or acetone for approximately 10 seconds up to 1 hour under nitrogen, followed by rinsing ultrasonically with fresh HFE-7100, then drying with nitrogen.

Figure 3F:
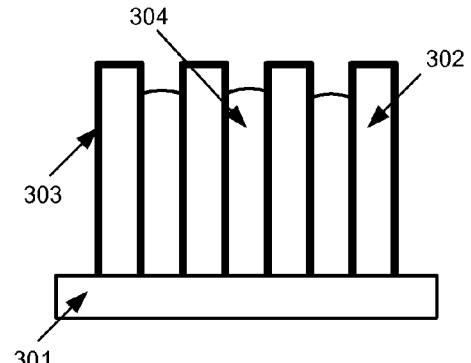
Figure 3G:
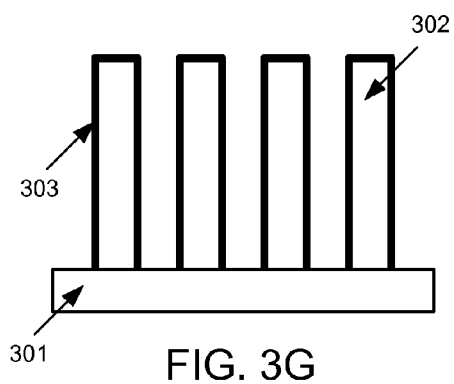

FIG. 3F shows the wafer 301 undergoing a wet processing (step 120) such as a wet cleaning after having the primer 303 applied. The liquid 304 from the wet processing is gathered within the nanostructures 302 and is repelled by the now more hydrophobic sidewalls of the nanostructures 302. The increased hydrophobicity of the sidewalls of the nanostructures 302 reduces the capillary forces present between the nanostructures 302 and prevents the formation of a concave meniscus in the fluid gathered within the features. FIG. 3G shows the wafer 301 after it has been dried from a DI water rinse (step 124). Optionally, the primer 303 may be removed after the drying, for example by an oxygen or carbon dioxide flash process. This would return the wafer 301 and nanostructures 302 to the state shown in FIG. 3D, but with any processing residue greatly reduced or removed.

Figure 4A:
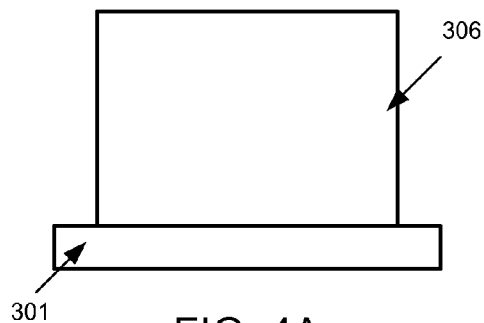
FIGS. 4A-4G show an exemplary wafer undergoing select steps of an embodiment of the invention.

FIGS. 4A-4G show an example of a wafer 301 with high aspect ratio nanostructures 302 at selected steps of another embodiment of the disclosed invention. FIG. 4A shows the result after step 102 has been performed. A layer of silicon based material 306 has been formed on the wafer 301. There are many processes that may be used to form the silicon based layer 306. For example, the layer may be formed by physical vapor deposition, chemical vapor deposition, electrochemical deposition or molecular beam epitaxy. While FIG. 4A shows a single uniform silicon based layer 306, it is important to note that multiple layers of materials may be used depending on many factors, such as the intended use of the circuit being fabricated or the specific fabrication process being used. Examples of multilayer structures include a stack consisting of TEOS at the top followed by SiN, then PolySi, and then Si at the bottom, or a stack consisting of SiN at the top followed by TEOS, then another layer of SiN, then PolySi, and then Si at the bottom.

Figure 4B:
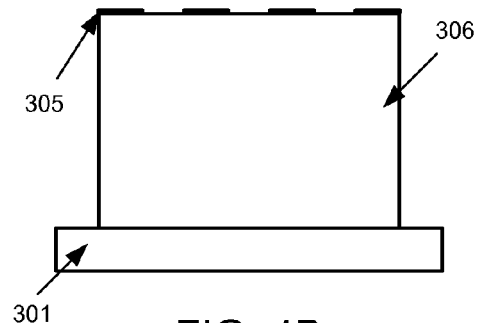

FIG. 4B shows the wafer 301 with the layer of silicon based material 306 and a photoresist layer 305 that has been patterned. A photoresist layer 305 is deposited on the silicon based material, often using a spin coating process and the photoresist is patterned using photolithography (step 104). The photoresist layer 305 is used as a mask to determine what silicon based material to remove and what to leave behind during the etching process. A wet or dry etching process (step 108) may be used to remove the material not covered by the photoresist 305.

Figure 4C:
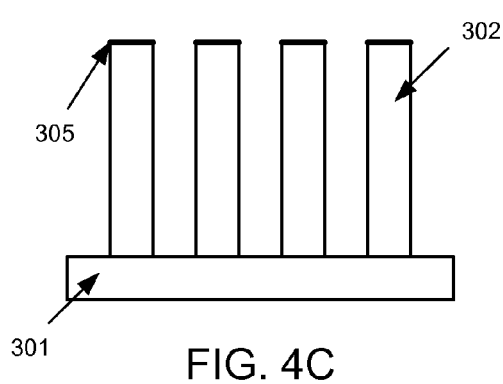

FIG. 4C shows the wafer 301 after the etching, showing the nanostructures 302 formed by the etching (step 108). At this point the photoresist 305 is still present. After the etching, the photoresist material 305 may then be removed (step 112). The photoresist 305 may be removed by a chemical stripping process or by an ashing process.

Figure 4D:
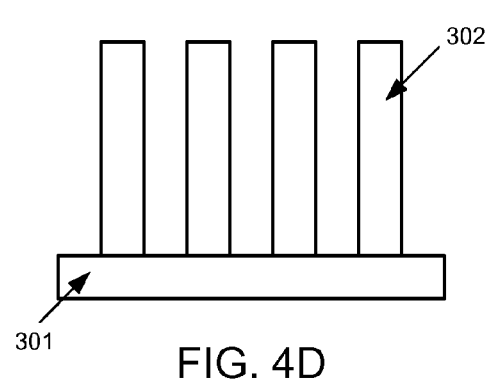

FIG. 4D shows a wafer 301 and four columns of the silicon based material that remain after etching and photoresist removal (step 112). The columns of the silicon based material make up the nanostructures 302. It is important to note that while the figures show a particular example of features that may be etched on the wafer 301, other numbers and types of features are possible.

Figure 4E:
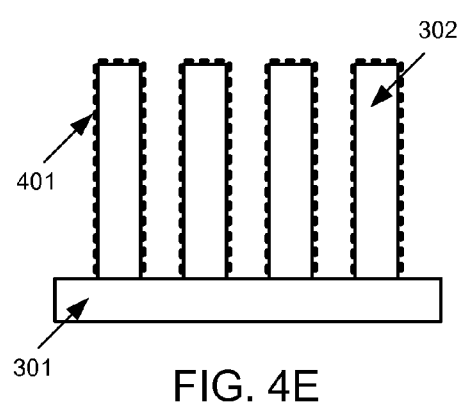

In this embodiment, the sidewalls of the nanostructures 302 are made more hydrophobic (step 116) by a roughening process. The surface of the nanostructures 302 can be reacted with a chemical substituent such that the surface morphology of the nanostructures 302 is changed. For example, while the photoresist 305 is spin-coated on the silicon based layer 306 the polymer resist can be exposed to a fluorine (F) and oxygen (O) mixture plasma to induce polymer re-deposition on the substrate. The re-deposited polymer generated by the plasma reaction is not a smooth thin film hence it can be used as a mask to etch the underlying substrate. An alternating deposition and etch process can be used to vary the surface roughness and achieve the required topography to produce a superhydrophobic surface via a subsequent $C_4F_8$ plasma thin film coating process. The change results in rough interfaces 401, as shown in FIG. 4E, with increased surface area for subsequent reactions with surface modifiers such that the surface becomes more hydrophobic. Roughening may be implemented by RIE texturing using polymerzing plasma and dry or vapor phase fluoride etching at increased temperature, for example.

Figure 4F:
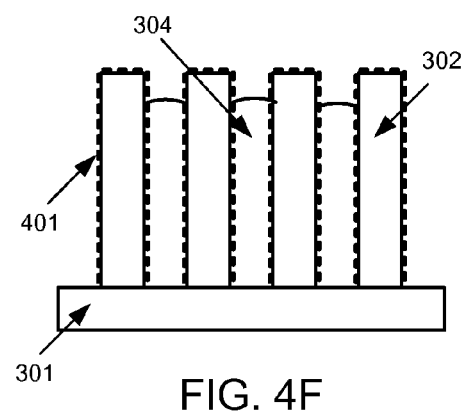
Figure 4G:
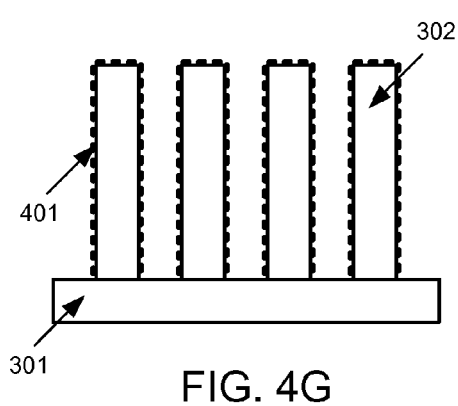

FIG. 4F shows the wafer 301 undergoing a wet processing (step 120) such as a wet cleaning after having surfaces of the nanostructures roughened to increase surface area for subsequent surface modification reactions. The liquid 304 from the wet processing is gathered within the nanostructures 302 and is repelled by the now more hydrophobic sidewalls of the nanostructures 302. The increased hydrophobicity of the sidewalls of the nanostructures 302 reduces the capillary forces present between the nanostructures 302 and prevents the formation of a concave meniscus in the fluid gathered within the features. FIG. 4G shows the wafer 301 after it has been dried (step 124) and showing no signs of feature collapse.

Figure 5A:
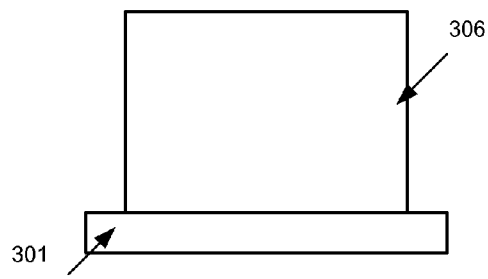
FIGS. 5A-5H show an exemplary wafer undergoing select steps of an embodiment of the invention.

FIGS. 5A-5H show an example of a wafer 301 with high aspect ratio nanostructures 302 at selected steps of another embodiment of the disclosed invention. FIG. 5A shows the result after step 102 has been performed. A layer of silicon based material 306 has been formed on the wafer 301. There are many processes that may be used to form the silicon based layer 306. For example, the layer may be formed by physical vapor deposition, chemical vapor deposition, electrochemical deposition or molecular beam epitaxy. While FIG. 5A shows a single uniform silicon based layer 306, it is important to note that multiple layers of materials may be used depending on many factors, such as the intended use of the circuit being fabricated or the specific fabrication process being used. Examples of multilayer structures include a stack consisting of TEOS at the top followed by SiN, then PolySi, and then Si at the bottom, or a stack consisting of SiN at the top followed by TEOS, then another layer of SiN, then PolySi, and then Si at the bottom.

Figure 5B:
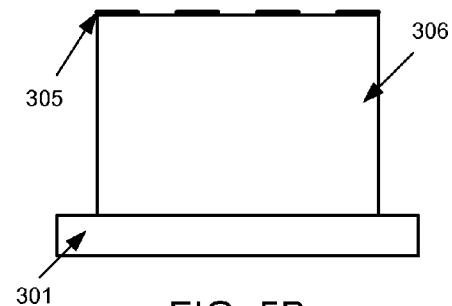

FIG. 5B shows the wafer 301 with the layer of silicon based material 306 and a photoresist layer 305 that has been patterned. A photoresist layer 305 is deposited on the silicon based material, often using a spin coating process and the photoresist is patterned using photolithography (step 104).

The photoresist layer 305 is used as a mask to determine what silicon based material to remove and what to leave behind during the etching process. A wet or dry etching process (step 108) may be used to remove the material not covered by the photoresist 305.

Figure 5C:
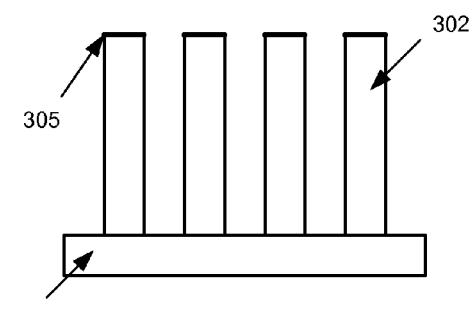

FIG. 5C shows the wafer 301 after the etching, showing the nanostructures 302 formed by the etching (step 108). At this point the photoresist 305 is still present. After the etching, the photoresist material 305 may then be removed (step 112). The photoresist 305 may be removed by a chemical stripping process or by an ashing process.

Figure 5D:
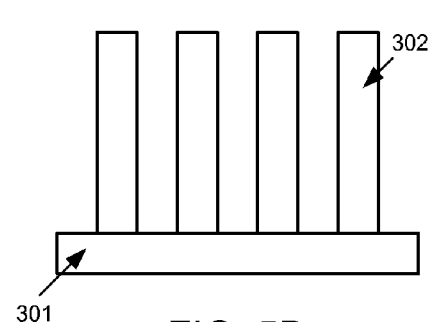

FIG. 5D shows a wafer 301 and four columns of the silicon based material that remain after etching and photoresist removal (step 112). The columns of the silicon based material make up the nanostructures 302. It is important to note that while the figures show a particular example of features that may be etched on the wafer 301, other numbers and types of features are possible.

Figure 5E:
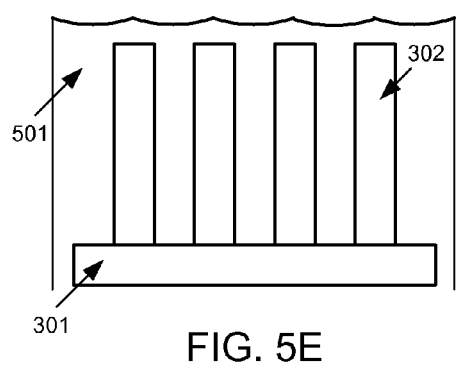

FIG. 5E shows the wafer 301 undergoing a wet cleaning during wet processing to clean etch or ash residue from previous processes. The wet cleaning chemicals 501 may include: aqueous, semi-aqueous or organic solutions of chemicals or combination of chemicals including HCl, HF, $NH_4F$, $NH_3$ aqueous solution, $H_2SO_4$, $H_2O_2$, for example.

Figure 5F:
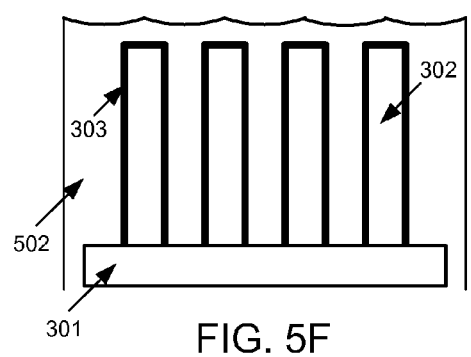

FIG. 5F shows the surfaces of the nanostructures 302 being made more hydrophobic by depositing surface modifying agents 303 during wet processing (step 126) after the wet cleaning shown in FIG. 5E. One particular example of a procedure to make the surfaces of the nanostructures 302 more hydrophobic is: 1) rinsing away the wet cleaning chemicals 501 with DI water, 2) replacing DI water with isopropyl alcohol, 3) replacing isopropyl alcohol with HFEs, 4) immersing the wafer into 0.01-50% by weight of FOTS in HFE for approximately 2 seconds-10 minutes, and 5) rinsing with HFE. An alternative example is: 1) rinsing away the wet cleaning chemicals 501 with DI water, 2) replacing DI water with organic solvents that don't contain an —OH group, but are also miscible with DI water (Examples of solvents having such properties include: DMF, DMAC, acetone, NMP.), 3) immersing the wafer into 0.01-50% by weight of FOTS in the organic solvent solution for approximately 2 seconds-10 minutes, and 4) rinsing with the organic solvent. Item 502 of FIG. 5F represents the chemicals used during the procedure of making the surfaces of the nanostructures 302 more hydrophobic.

Figure 5G:
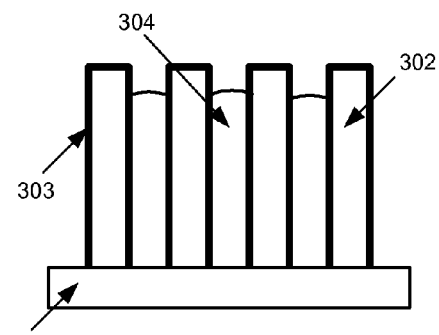

FIG. 5G shows the step to re-introduce DI water 304 into the hydrophobic nanostructures 302 after FIG. 5F to exploit the high Laplace pressure generated by convex water meniscus inside the hydrophobic nanostructures 302 to prevent the nanostructures 302 from collapse during the drying process. One particular example of doing so is: 1) replacing the HFE with isopropyl alcohol, and 2) replacing isopropyl alcohol with DI water. Since isopropyl alcohol has a lower surface tension than DI water and is miscible with DI water, immersion in isopropyl alcohol first then in DI water can introduce DI water into the hydrophobic nanostructures 302 through diffusion process. Alternatively, if the step represented by FIG. 5F ends with an organic solvent that does not contain —OH group, but miscible with water, a simple DI water wash step can be applied here.

Figure 5H:
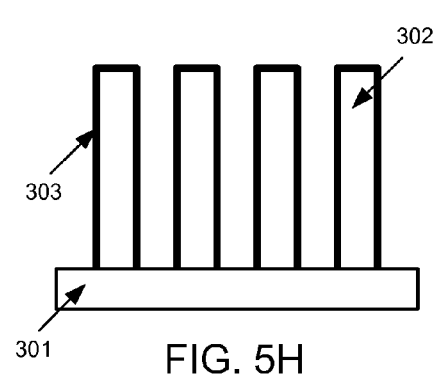

FIG. 5H shows intact high density high aspect ratio nanostructures 302 after drying.

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A method of processing a wafer used in fabricating semiconductor devices, said method comprising:
    forming high aspect ratio features in a silicon based layer on the wafer, wherein the high aspect ratio features are formed utilizing a dry etching process;
    making sidewalls of the high aspect ratio features more hydrophobic without needing to wet the high aspect ratio features before the making the sidewalls of the high aspect ratio features more hydrophobic, wherein the sidewalls of the high aspect ratio features are made more hydrophobic prior to performing wet processing of the high aspect ratio features of the wafer;
    performing wet processing of the high aspect ratio features of the wafer; and
    subsequently drying the wafer.

2. The method of claim 1, wherein the making the sidewalls of the high aspect ratio features more hydrophobic is accomplished by depositing a primer on the wafer, wherein the primer makes the sidewalls more hydrophobic by chemically altering the surface of the high aspect ratio features.

3. The method of claim 2, wherein the primer is deposited on the wafer by way of vapor deposition.

4. The method of claim 3, wherein the depositing of the primer on the wafer prior to the wet processing comprises:
    generating a primer solution by mixing a solution of 0.1-50% by weight of $C_8F_{13}H_4SiCl_3$ (FOTS) in anhydrous n-hexane; and
    co-heating a portion of the primer solution with the wafer such that the primer solution evaporates and the FOTS molecule reacts with the sidewalls of the-features.

5. The method of claim 2, wherein the primer comprises a self-assembled monolayer.

6. The method of claim 2, wherein the primer comprises a film, and wherein the film comprises at least one of: hexamethyldisiloxane, an alkoxysilane or an alkylsilane.

7. The method of claim 1, wherein the making the sidewalls more hydrophobic is accomplished by roughening the sidewalls.

8. The method of claim 7, wherein the roughening of the sidewalls is accomplished by way of exposing the wafer to at least of: polymerizing plasma, hydrogen fluoride vapor or fluoride based plasma etch.

9. The method of claim 7, wherein the roughening of the sidewalls is accomplished by reactive-ion etching.

10. The method of claim 1, wherein forming of the high aspect ratio features comprises:
    forming a photoresist patterned mask over the silicon based layer; and
    etching the high aspect ratio features into the silicon based layer.

11. The method of claim 10, wherein the forming the high aspect ratio features further comprises stripping the photoresist patterned mask.

* * * * *